(12) United States Patent  (10) Patent No.: US 7,969,009 B2
Chandrasekaran  (45) Date of Patent: Jun. 28, 2011

(54) THROUGH SILICON VIA BRIDGE INTERCONNECT

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 456 days.

(21) Appl. No.: 12/164,331

(22) Filed: Jun. 30, 2008

(65) Prior Publication Data

US 2009/0321939 A1    Dec. 31, 2009

(51) Int. Cl.
*H01L 29/02* (2006.01)
(52) U.S. Cl. .. 257/758; 257/778; 257/774; 257/E29.002
(58) Field of Classification Search ............ 257/758, 257/E29.002, 778
See application file for complete search history.

(56) References Cited

U.S. PATENT DOCUMENTS

| 5,225,633 | A | 7/1993 | Wigginton |
| 2006/0095639 | A1 | 5/2006 | Guenin et al. |
| 2007/0216036 | A1* | 9/2007 | Krishnamoorthy et al. .. 257/782 |

FOREIGN PATENT DOCUMENTS

| EP | 1587141 A2 | 10/2005 |
| WO | 0180317 | 10/2001 |

OTHER PUBLICATIONS

International Search Report—PCT/US2009/048372, International Search Authority—European Patent Office Nov. 26, 2009.
Written Opinion—PCT/US2009/048372, International Search Authority—European Patent Office Nov. 26, 2009.

* cited by examiner

*Primary Examiner* — Benjamin P Sandvik
*Assistant Examiner* — Krista Soderholm
(74) *Attorney, Agent, or Firm* — Michelle Gallardo; Nicholas J. Pauley; Jonathan T. Velasco

(57) ABSTRACT

An integrated circuit bridge interconnect system includes a first die and a second die provided in a side-by-side configuration and electrically interconnected to each other by a bridge die. The bridge die includes through silicon vias (TSVs) to connect conductive interconnect lines on the bridge die to the first die and the second die. Active circuitry, other than interconnect lines, may be provided on the bridge die. At least one or more additional die may be stacked on the bridge die and interconnected to the bridge die.

18 Claims, 5 Drawing Sheets

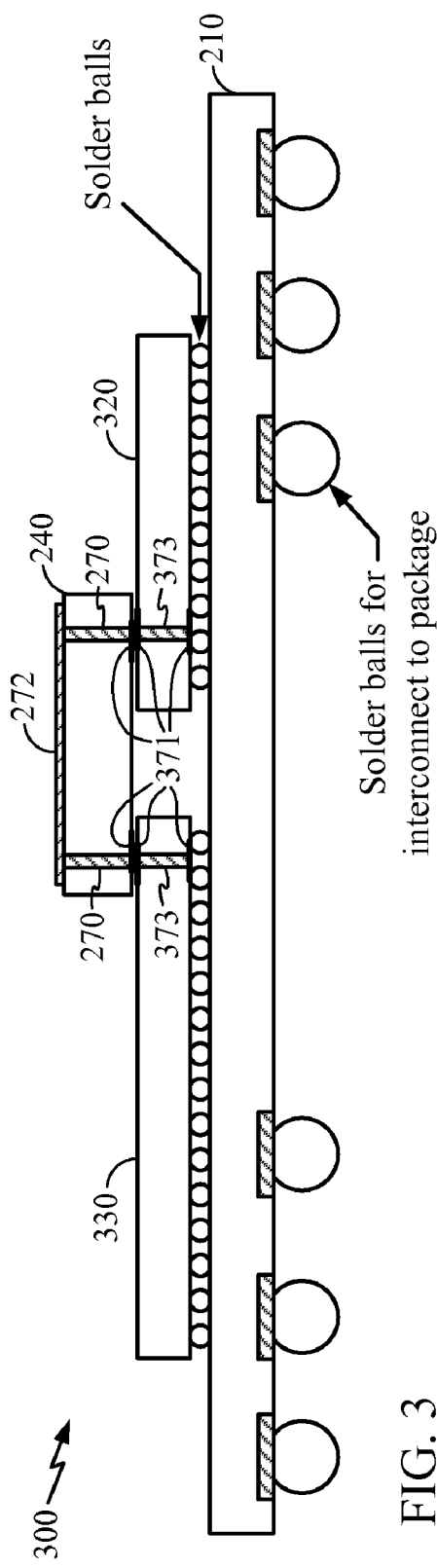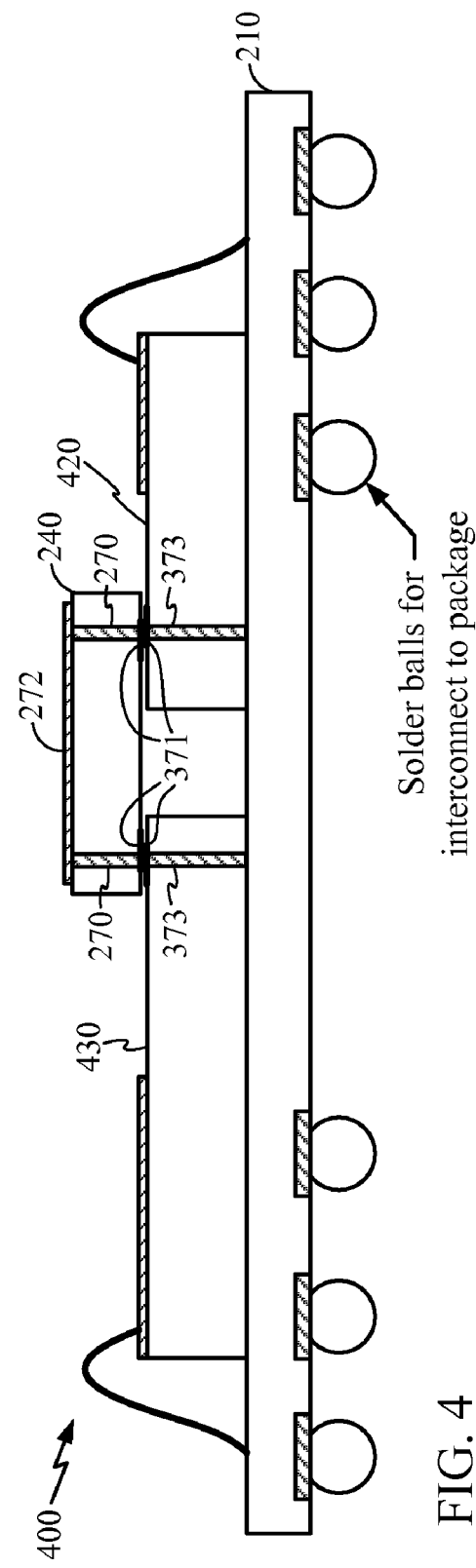

THROUGH SILICON VIA BRIDGE INTERCONNECT

TECHNICAL FIELD

This disclosure relates to integrated circuit (IC) packaging, and more specifically to bridge interconnections between side-by-side integrated circuits within a substrate package.

BACKGROUND

In IC packaging there is a need to provide semiconductor dies in a side-by-side configuration within a package and interconnect them. The package may be, for example, a lead frame package.

In one configuration, semiconductor dies are packaged with the active side of each die facing away from the package base. Interconnection between dies is achieved by wire bonding. However, design rules for assembly interconnection may be limited by dimensions of the wire diameter and wire-bonding capillary tool, requiring bonding pads that are large enough and spaced sufficiently far apart to accommodate the dimensions. Thus the number of interconnects is limited by the size of the interconnects. In addition, lead inductance in the die-to-die wire bond may limit performance of the packaged device. Furthermore, gold wire is a conventional choice for wire bonding, increasing significantly the net cost of the package.

In another configuration, flip-chip solderball packaging, the active device region of the die is on the surface facing the package mounting substrate, e.g., downward. In this configuration, interconnection density between adjacent dies is also limited by contact pad size requirements.

U.S. Pat. No. 5,225,633 discloses interconnecting two semiconductor dies in a side-by-side configuration using bridge elements. Each bridge element comprises a rigid silicon die supporting overhanging conducting beam leads. The bridge is placed in a space between two semiconductor dies, and the extent of overhang of each beam lead and adjacent positioning are selected to provide proper mating with bonding pads positioned on each of the semiconductor dies to be interconnected. However, no method of forming the beam leads or disposing them on the silicon bridge is disclosed. Moreover, handling and assembling beam leads may be difficult, and the bridge occupies space between the two dies. Furthermore, as gold is a preferred interconnect metal, there is an impact on the material cost of the assembled package.

There is a need, therefore, for a packaging interconnect system between adjacent semiconductor dies that simplifies the assembly process, reduces the cost of interconnect materials, and enables interconnection between chips with a finer pitch than is conventionally permissible with wire bonding and equivalent beam lead interconnections.

SUMMARY

A system and method to interconnect two die in a side-by-side configuration is disclosed. A third semiconductor die functions as an interconnection bridge to connect the two die. The bridge die includes through silicon vias (TSVs) to facilitate the interconnection.

An integrated circuit bridge interconnect system includes a first die having a first side and a second side and a second die having a first side and a second side. These die are provided in a side-by-side configuration. A bridge die is disposed on the first sides of the first die and the second die. The bridge die interconnects the first die and the second die.

An integrated circuit packaging system includes a package to contain semiconductor dies and a substrate disposed within the package for receiving semiconductor dies. A first die and a second die, both having a first side and a second side, are disposed on the substrate in a side-by-side configuration. The second sides of the first and second dies face the substrate. A bridge die is disposed on the first sides of the first die and the second die. The bridge die interconnects the first die and the second die.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 3 is an exemplary exploded cross-section view of an embodiment of bridge interconnect between two flip-chip dies.

FIG. 4 is an exemplary exploded cross-section view of an embodiment of bridge interconnect between two wire-bond dies.

DETAILED DESCRIPTION

Methods and structures are disclosed for connecting two semiconductor die (chips), which are placed in a side-by-side configuration in a substrate-based package. The connections may be accomplished by using a semiconductor interconnect bridge die (typically silicon) to make contact with both side-by-side dies. The interconnect bridge die has through silicon vias to connect contact pads on each of the dies to the opposite surface of the interconnect bridge die. Interconnect lines on the interconnect bridge die are formed to complete the connections between the through silicon vias.

Figure 1:
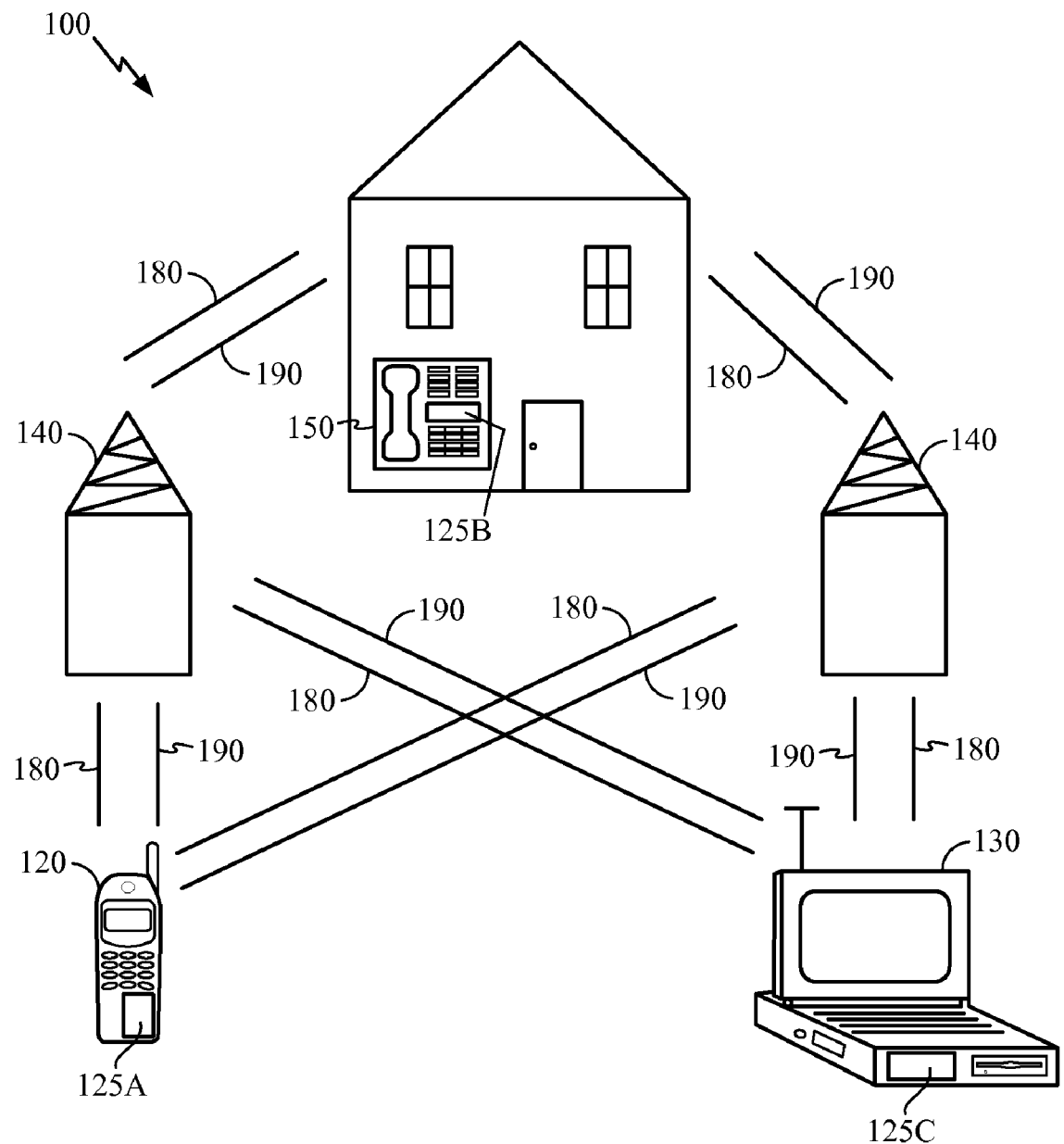
FIG. 1 shows an exemplary wireless communication system in which embodiments of the invention may be advantageously employed.

FIG. 1 shows an exemplary wireless communication system 100 in which an embodiment of the invention may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include through silicon via (TSV) bridge interconnect multi-chip packages 125A, 125B and 125C, which is an embodiment of the invention as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the invention, the invention is not limited to these exemplary illustrated units. The invention may be suitably employed in any device which includes a multi-chip package having chips in a side-by-side configuration.

Figure 2:
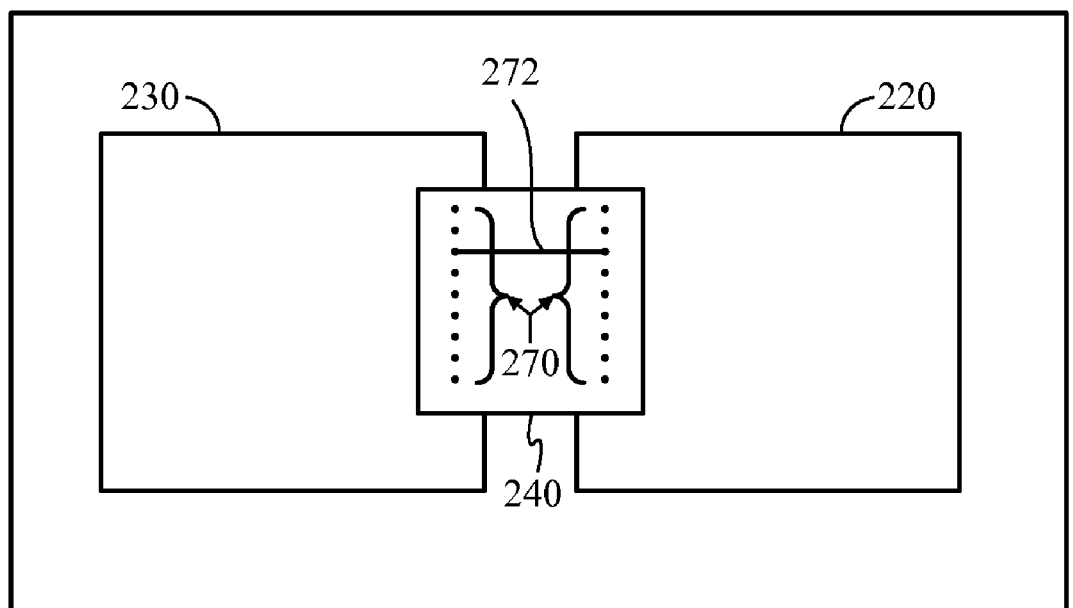
FIG. 2 illustrates a plan view of a TSV bridge interconnect according to an embodiment of the invention.

FIG. 2 illustrates a plan view of a TSV bridge interconnect configuration 200 according to an embodiment of the invention. Configuration 200 includes a substrate 210, which may be, for example, an organic or ceramic substrate printed circuit board. Two or more die, where each die has a first and a second side, may be placed on the substrate 210. For exemplary illustration, referring to FIG. 2, the two die 220 and 230 are shown placed in a side-by-side configuration. One surface of the dies 220 and 230 may connect to the substrate 210, and eventually to package leads.

A bridge interconnect die 240 having a first and a second side at least partially overlaps and electrically communicates with the dies 220 and 230. Through silicon vias (TSVs) 270 filled with conductive metal, connect the first side (shown facing out of the page) of the bridge interconnect die 240 to the active circuitry on the dies 220 and 230. Interconnect lines 272 on the first side of the bridge interconnect die 240 then complete the connections between dies 220 and 230. For different functional applications, where the specific functions of the dies 220 and 230 change, the interconnect lines 272 may be appropriately re-routed and the TSVs 270 relocated by a change in photomasks and fabrication at the wafer scale level of processing.

Furthermore, while the interconnect lines 272 may principally be passive metal interconnects, they may also be more complicated circuitry interconnects, such as impedance components (i.e., resistors, capacitors and inductors), and active devices (i.e., transistors, logic, memory, etc.). Although not shown in FIG. 2, the first side of the bridge interconnect die 240 can include additional active circuitry, unrelated to the interconnect functionality.

The interconnect lines 272 and/or circuitry on the bridge interconnect die 240 may be formed at the wafer level, including formation of the metal filled holes TSVs 270 using conventional semiconductor and metallization processes, after which the wafer may then be separated into individual bridge interconnect dies 240.

FIG. 3 is an exemplary exploded cross-section view of an embodiment of a configuration 300 of a bridge interconnect between two flip-chip dies. The active circuitry of the flip-chip die 320 and die 330 is on the second sides, facing the substrate 210. Dies 320 and 330 may attach to the substrate 210 by, for example, solder-ball bonding, or equivalent methods used in packaging integrated circuits.

Through silicon vias (TSVs) 373 are formed through the thickness of the dies 320 and 330 to provide for metallic interconnection between the first sides (shown facing up in FIG. 2) and the active circuitry on the second sides of dies 320 and 330.

Contact pads 371 on the second side of the bridge interconnect die 240 and the first sides of the dies 320 and 330 are aligned, and may be bonded using methods such as, for example, solder-ball bonding, and conductive paste. The contact pads 371 formed on the dies 320, 330 and 240 enable conductive contact between the corresponding TSVs 270 and 373. Consequently, the active circuitry on the dies 320 and 330 are electrically connected to the first side of the bridge interconnect die 240, where the interconnection between the active circuitry is completed using interconnect lines 272. Contact pads 371 are shown interconnecting the active circuitry and the solder balls.

FIG. 4 is an exemplary exploded cross-section view of an embodiment of a configuration 400 of a bridge interconnect between two wire bond dies 420 and 430. The bridge interconnect die 240 may be substantially the same as the bridge interconnect die 240 shown in FIG. 3. That is, the bridge interconnect die 240 of FIG. 4 may have the same features and arrangement of TSVs 270, contact pads 371, interconnect lines 272 and optionally, impedance elements and/or active devices, also placed on the first side of the bridge interconnect die 240 of FIG. 3.

Semiconductor wire bond dies 420 and 430 both have a first side and a second side, where the second sides of the dies 420 and 430 face and are attached to the substrate 210. Wire bonding connects contact pads on the first sides of the dies 420 and 430 to contact pads on the substrate 210. As in the flip-chip configuration 300 of FIG. 3, all three dies 420, 430 and 240 have contact pads 371 at corresponding locations to enable interconnection of circuitry of the dies 420 and 430 through the bridge interconnect die 240.

Active circuitry on the dies 420 and 430 are located on the first surface (i.e., facing away from the substrate 210). In configuration 400, because the active circuitry is on the first side, the inclusion of TSVs 373 in the dies 420 and 430, as shown in FIG. 4, may be optionally included, or may not be required.

Figure 5:
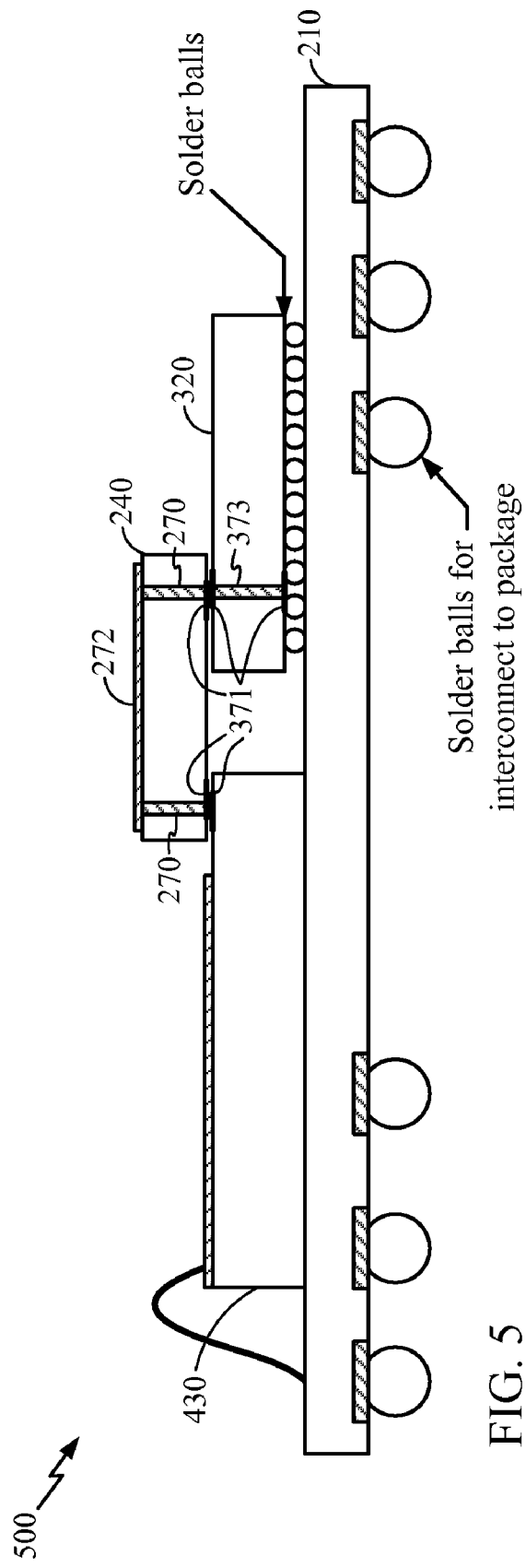
FIG. 5 is an exemplary exploded cross-section view of an embodiment of bridge interconnect between a flip-chip die and a wire-bond die.

FIG. 5 is an exemplary exploded cross-section view of an embodiment of a configuration 500 of a bridge interconnect between the flip-chip die 320 and the wire-bond die 430. Appropriate compensation may be made for relative differences in die thickness, ball-bond height, etc., to position the first sides of both dies 320 and 430 at the same height. Consideration of appropriate interfaces between flip-chip, bridge and wire-bond dies are the same as described with reference to FIGS. 3 and 4. For example, the flip-chip die 320 has active circuitry disposed on the second side (i.e., facing the substrate 210) and may require a plurality of TSVs 373 connected to contact pads 371 on the first side to facilitate connections to the bridge interconnect die 240. The wire bond die 430, on the other hand, has active circuitry disposed on the first side (i.e., facing away from the substrate 210), and may not require the TSVs 373. Instead, the contact pads 371 connected to the active circuitry may be sufficient.

Figure 6:
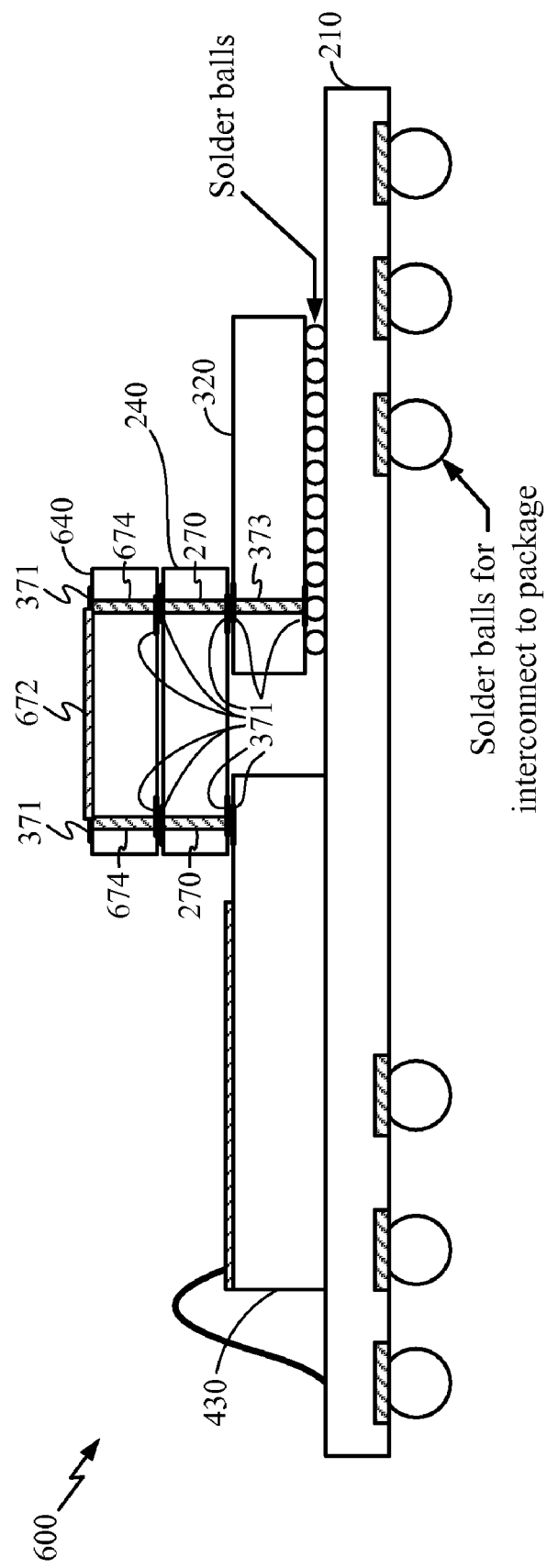
FIG. 6 is an exemplary exploded cross-section view of an embodiment in which additional dies are stacked on a bridge interconnect.

FIG. 6 is an exemplary cross-section view of an embodiment of a configuration 600 in which at least one or more additional dies 640 (where, for illustrative purposes, only one die 640 is shown) are stacked on the bridge interconnect die

240. The additional die 640 may include a functionality, material technology or other basis for forming the die 640 separately from other dies 320, 430 containing active devices. The interconnect bridge die 240 can include contact pads 371 on the first side to interface with corresponding contact pads 371 facing opposite and located on the die 640. The die 640 may include TSVs 674 connected to contact pads 371 on both sides of the die 640 to provide interconnection between the interconnect bridge die 240 and interconnect lines 672 and/or functional circuitry on the top surface of the die 640. Examples of functionality of the die 640 include memory, delay, amplifiers, logic, etc. Stacking of additional dies 640 over the interconnect bridge die 240 may be considered, according to functionality, packaging and other desired objectives. Where ball bonding is employed to interconnect pads on (vertically stacked) adjacent die, the disposition of circuitry may be on either the first or the second side of the die 640.

Numerous advantages may be derived from the embodiments described. Using a bridge die, the interconnect traces may be fabricated in quantity at wafer scale using semiconductor processes. Metallization thickness may be on the order of a few microns or less, with line widths suitable to advancing technology nodes such as 45 nm and less. The metal may be other than gold. Compared to gold wire bonding between substrates, substantial material savings may be realized.

Additionally, wire bonding requires a minimum spacing between adjacent contact pads on a substrate, for reasons due, at least in part, to the size of the capillary tip used in wire bonding. In contrast, a very fine pitch of the interconnect traces on the bridge die is possible, making dense interconnects possible. Furthermore, with wire bonding, each bond is accomplished individually, whereas with a bridge interconnect, multiple bonds are accomplished with one chip-level placement and bonding methods such as, for example, solder reflow.

Furthermore, where a side-by-side multi-chip configuration has been previously designed for wire bonding, a bridge interconnect may be beneficially implemented to replace wire bonding, while making use of existing contact pads. A bridge interconnect replacement for wire bonding reduces the number of assembly steps from multiple separate wire bond steps to a single die placement.

Still furthermore, wire bonding typically involves a loop in the arc of the wire between two bonding pads in addition to a minimum required distance between bonding pads. As a result wire inductance may degrade performance, especially in high speed devices where inductive impedance increases with frequency. Electromagnetic radiation from the leads may be undesirably detected elsewhere on the chips within the package. With a bridge die, the dies to be connected may be placed close together, reducing radiation and increasing package utilization efficiency. The bridge die may be made quite small, with correspondingly shorter interconnect paths than would be required with wire bonds.

A yet further advantage is the efficient ability to include in a single package two or more integrated circuits that require different materials, process flows or technology nodes to optimize the "system level" performance afforded by the customized benefits of each chip. This enables higher level functionality in a single package.

A still further advantage is the ability to include functionality on the bridge die, which cannot be enabled by wire bonding alone.

Many of the same advantages apply when flip-chip bonding is used to package integrated circuit dies. By implementing TSVs on flip-chip dies, fine pitch interconnects and economy of wire routing space may be enabled.

Although the present invention and its advantages have been described in detail, it should be understood that various changes, substitutions and alterations can be made herein without departing from the spirit and scope of the invention as defined by the appended claims. For example, although a read operation has been used in the discussion, it is envisioned that the invention equally applies to write operations. Moreover, the scope of the present application is not intended to be limited to the particular embodiments of the process, machine, manufacture, composition of matter, means, methods and steps described in the specification. For example, whereas TSV is a common term of art referring to vias in silicon dies, vias may be formed in other materials, and in particular other semiconductor dies such as GaAs, SiC, GaN, or other suitable materials. The term TSV may be applied with application to any such materials. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit bridge interconnect system, comprising:
   a first die having a first side and a second side;
   a second die, having a first side and a second side, provided in a side-by-side configuration with the first die; and
   a bridge die, having a first side and a second side, disposed at least partially on the first sides of the first die and the second die, the bridge die electrically interconnecting the first die and the second die, the bridge die having bridge die through vias from the first side of the bridge die to the second side of the bridge die, the bridge die through vias being filled with metallizations to connect conductive lines on the first side of the bridge die to enable the interconnecting.

2. The system of claim 1, in which the bridge die further comprises active circuitry on the first side.

3. The system of claim 1, in which one or more contact pads on the second side of the bridge die contact a corresponding one or more contact pads on the first sides of the first and second dies.

4. The system of claim 1, in which at least one of the first and second dies comprise:
   a flip-chip die having circuitry disposed on the second side; and
   flip-chip through vias from the first side of the flip-chip die to the second side of the flip-chip die, the flip-chip through vias being filled with metallizations to connect active circuitry on the second side of the flip-chip die to one or more contact pads on the first side of the flip-chip die.

5. The system of claim 1, in which at least one of the first and second dies comprises circuitry disposed on the first side of the die.

6. The system of claim 1, further comprising:
   one or more contact pads on the first and the second die.

7. The system of claim 6, wherein the bridge die further comprises:

one or more contact pads on the second side of the bridge die corresponding to the bridge die through vias and opposite to and corresponding to the one or more contact pads on the first and/or second die first sides.

8. The system of claim 7, further comprising:
at least one additional die stacked on the bridge die, the at least one additional die further comprising passive, active and/or interconnect circuitry.

9. The system of claim 1, wherein the bridge die is fabricated using a process flow that is different from a process flow corresponding to the first and/or the second dies.

10. An integrated circuit packaging system comprising:
a package to contain semiconductor dies;
a substrate disposed within the package for receiving semiconductor dies;
a first die having a first side and a second side, wherein the first die is disposed on the substrate with the second side facing the substrate;
a second die having a first side and a second side provided in a side-by-side configuration with the first die, wherein the second die is disposed on the substrate with the second side facing the substrate; and
a bridge die, having a first side and a second side, wherein the bridge die is disposed at least partially on the first sides of the first die and the second die, the bridge die interconnecting the first die and the second die, the bridge die comprising bridge die through vias from the first side of the bridge die to the second side of the bridge die, the bridge die through vias being filled with metallization to connect conductive lines on the first side of the bridge die to enable the interconnecting.

11. The packaging system of claim 10, in which the bridge die further comprises active circuitry on the first side.

12. The packaging system of claim 10, in which one or more contact pads on the second side of the bridge die contact a corresponding one or more contact pads on the first sides of the first and second dies.

13. The packaging system of claim 10, in which at least one of the first and second dies comprise:
a flip-chip die having circuitry disposed on the second side, wherein the flip-chip is coupled to the substrate by ball bonding, solder bump bonding or conductive paste;
flip-chip through vias from the first side to the second side of the flip-chip die; and
the flip-chip through vias being filled with metallizations to connect conductive lines on the second side to a one or more contact pads on the first side of the flip-chip die.

14. The packaging system of claim 10, in which at least one of the first and second die comprise circuitry disposed on the first side of the die.

15. The packaging system of claim 10, further comprising:
the first and the second die each having a one or more contact pads.

16. The packaging system of claim 15, wherein the bridge die further comprises:
one or more contact pads on the second side of the bridge die corresponding to the bridge die through vias and opposite to and corresponding to the one or more contact pads on the first and/or second die first sides.

17. The packaging system of claim 16, further comprising:
at least one additional die stacked on the bridge die, the at least one additional die further comprising passive, active and/or interconnect circuitry.

18. The packaging system of claim 10, wherein the bridge die is fabricated using a process flow that is different from a process flow corresponding to the first and/or the second dies.

* * * * *